United States Patent
Sun et al.

(10) Patent No.: US 10,510,814 B2
(45) Date of Patent: Dec. 17, 2019

(54) OLED DISPLAY PANEL AND DISPLAY DEVICE

(71) Applicant: BOE TECHNOLOGY GROUP CO., LTD., Beijing (CN)

(72) Inventors: Yanliu Sun, Beijing (CN); Shiming Shi, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/744,499

(22) PCT Filed: Jun. 13, 2017

(86) PCT No.: PCT/CN2017/088081
§ 371 (c)(1),
(2) Date: Jan. 12, 2018

(87) PCT Pub. No.: WO2018/113207
PCT Pub. Date: Jun. 28, 2018

(65) Prior Publication Data
US 2019/0006440 A1    Jan. 3, 2019

(30) Foreign Application Priority Data
Dec. 23, 2016  (CN) .......................... 2016 1 1207500

(51) Int. Cl.
*H01L 27/32* (2006.01)
*G06K 9/00* (2006.01)

(52) U.S. Cl.
CPC ........ *H01L 27/3234* (2013.01); *G06K 9/0004* (2013.01); *H01L 27/3248* (2013.01);
(Continued)

(58) Field of Classification Search
CPC ............. H01L 27/3234; H01L 27/3272; H01L 27/3248; H01L 27/3276; G06K 9/0004; G06K 9/00026
(Continued)

(56) References Cited

U.S. PATENT DOCUMENTS 9,804,720 B2    10/2017  Liu
2005/0012097 A1*  1/2005  Yamazaki ............... H01L 27/12
                                                      257/59
(Continued)

FOREIGN PATENT DOCUMENTS

CN    106024833 A    10/2016
CN    106033765 A    10/2016

OTHER PUBLICATIONS

International Search Report of PCT/CN2017/088081 in Chinese, dated Sep. 13, 2017 with English translation.
(Continued)

*Primary Examiner* — Vongsavanh Sengdara
(74) *Attorney, Agent, or Firm* — Collard & Roe, P.C.

(57) ABSTRACT

An OLED display panel and a display device are provided. An image sensor is added below OLED light-emitting devices, a light shielding layer including at least one pinhole imaging region is added between the image sensor and the OLED light emitting device, with the pinhole imaging region corresponding to a gap position between the OLED light-emitting devices in the light shielding layer and staggered from light shielding parts in a signal routing and a control device, an object located above the OLED display panel is imaged on the image sensor.

17 Claims, 4 Drawing Sheets

(52) U.S. Cl.
CPC ...... *H01L 27/3272* (2013.01); *G06K 9/00026* (2013.01); *H01L 27/3276* (2013.01)

(58) Field of Classification Search
USPC .......................................... 257/240
See application file for complete search history.

(56) References Cited

U.S. PATENT DOCUMENTS

| | | | |
|---|---|---|---|
| 2005/0189535 A1* | 9/2005 | Hsueh | H01L 51/5284 257/40 |
| 2009/0243470 A1* | 10/2009 | Chu | H01L 27/3248 313/504 |
| 2014/0077183 A1* | 3/2014 | Lee | H01L 51/5253 257/40 |
| 2014/0218327 A1* | 8/2014 | Shi | G06F 3/041 345/174 |
| 2016/0163747 A1* | 6/2016 | Koide | H01L 27/1443 257/80 |
| 2017/0161543 A1* | 6/2017 | Smith | G06K 9/0008 |
| 2017/0220838 A1* | 8/2017 | He | G06K 9/0004 |
| 2017/0220844 A1* | 8/2017 | Jones | G06K 9/0053 |
| 2017/0221960 A1* | 8/2017 | Lin | H01L 27/14678 |

OTHER PUBLICATIONS

Notice of Transmittal of the International Search Report of PCT/CN2017/088081 in Chinese, dated Sep. 13, 2017.
Written Opinion of the International Searching Authority of PCT/CN2017/088081 in Chinese, dated Sep. 13, 2017 with English translation.

* cited by examiner

OLED DISPLAY PANEL AND DISPLAY DEVICE

CROSS REFERENCE TO RELATED APPLICATIONS

This application is the National Stage of PCT/CN2017/088081 filed on Jun. 13, 2017, which claims priority under 35 U.S.C. § 119 of Chinese Application No. 201611207500.8 filed on Dec. 23, 2016, the disclosure of which is incorporated by reference.

TECHNICAL FIELD

Embodiments of the present disclosure relate to an OLED display panel and a display device.

BACKGROUND

An Organic Light-Emitting Diode (OLED) display panel has a trend of developing into narrow frame and whole surface display. Additional fingerprint recognition, a camera, a microphone and the like on a whole surface of a traditional OLED display panel cannot meet new requirements of users, and other fingerprint recognition manners need to be developed.

SUMMARY

Embodiments of the present disclosure relate to an OLED display panel and a display device, which can realize the fingerprint recognition function in the display area of the OLED display panel.

At least one embodiment of the present disclosure provides an OLED display panel, comprising: a substrate; a plurality of OLED light-emitting devices arranged on a side of the substrate; a signal routing and a control device correspondingly connected with the OLED light-emitting devices; an image sensor arranged on the other side or the same side of the substrate; and a light shielding layer arranged between the image sensor and a film layer where the OLED light-emitting devices are located, the light shielding layer comprising at least one pinhole imaging region.

An orthographic projection position of the pinhole imaging region on the substrate is arranged at a gap position between the OLED light-emitting devices, and is staggered from orthographic projection positions of light shielding parts in the signal routing and the control device on the substrate.

The image sensor is configured to acquire an image formed after an object above the OLED display panel passes through the pinhole imaging region.

In a possible implementation, in the OLED display panel provided by the embodiment of the present disclosure, the pinhole imaging region comprises a plurality of holes distributed in an array.

In a possible implementation, in the OLED display panel provided by the embodiment of the present disclosure, in a pinhole imaging region, a center distance d between every two adjacent holes satisfies one of the following or a combination relationship: $d<2*(h_o+h_t/2)*\tan(\arcsin(1/n))$, $d>2*(h_d+h_t/2)*\tan(\arcsin(1/n))$; where n is a refractive index of a film layer in contact with a receiving surface of the image sensor, $h_d$ is a distance between a lower surface of the light shielding layer and an upper surface of the image sensor, $h_t$ is a thickness of the light shielding layer, and $h_o$ is a distance between an upper surface of the light shielding layer and an upper surface of the OLED display panel.

In a possible implementation, in the OLED display panel provided by the embodiment of the present disclosure, each hole has a diameter in a range of 5 μm to 20 μm.

In a possible implementation, in the OLED display panel provided by the embodiment of the present disclosure, the pinhole imaging region and a corresponding OLED light-emitting device of the closest to the pinhole imaging region satisfy a following relationship: a horizontal distance between the pinhole imaging region and the corresponding OLED light-emitting device closest to the pinhole imaging region is larger than a vertical distance between the pinhole imaging region and the corresponding OLED light-emitting device closest to the pinhole imaging region.

In a possible implementation, in the OLED display panel provided by the embodiment of the present disclosure, the signal routing comprises a data line arranged between the film layer where the OLED light-emitting devices are located and the substrate; the light shielding layer is arranged between the film layer where the OLED light-emitting devices are located and a film layer where the data line is located; and the light shielding layer further comprises: a connecting through hole configured to connect a drain electrode in the film layer where the data line is located, or a pattern comprising the drain electrode with an anode in the OLED light-emitting device.

In a possible implementation, in the OLED display panel provided by the embodiment of the present disclosure, the anode in the OLED light-emitting device comprises a layer stack structure comprising a light shielding metal film layer; and an orthographic projection of the anode in the OLED light-emitting device on the substrate covers an orthographic projection of the connecting through hole.

In a possible implementation, in the OLED display panel provided by the embodiment of the present disclosure, the signal routing included in the film layer where the data line is located is a data line; and the light shielding layer is configured into a conductive layer loading a direct current voltage signal.

In a possible implementation, in the OLED display panel provided by the embodiment of the present disclosure, the light shielding layer further comprises a hollow region arranged above at least a part of the data line; and the anode in the OLED light-emitting device comprises a layer stack structure comprising a light shielding metal film layer, and an orthographic projection of the anode on the substrate covers an orthographic projection of the hollow region.

In a possible implementation, in the OLED display panel provided by the embodiment of the present disclosure, the data line has a line width larger than 2.3 μm, and the film layer where the data line is located has a thickness less than 700 nm.

In a possible implementation, in the OLED display panel provided by the embodiment of the present disclosure, the line width of the data line is 3.5 μm, and the thickness of the film layer where the data line is located is 500 nm.

In a possible implementation, in the OLED display panel provided by the embodiment of the present disclosure, the anode in the OLED light-emitting device has an area larger than that of a light-emitting layer in the OLED light-emitting device.

In a possible implementation, in the OLED display panel provided by the embodiment of the present disclosure, the image sensor is arranged in a whole surface manner, or is only arranged below the pinhole imaging region.

Embodiments of the present disclosure also provide a display device, comprising any one of the OLED display devices.

BRIEF DESCRIPTION OF THE DRAWINGS

The embodiments of the present disclosure are illustrated in more details in connection with the drawings, so that those skilled in the art can understand the embodiments of the present disclosure more clearly, in which.

DETAILED DESCRIPTION

Technical solutions of the embodiment will be described in a clearly and fully understandable way in conjunction with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

The inventors noticed that a fingerprint recognition technology developed in an active area (AA) of a display panel can effectively reduce attached regions of an OLED display panel to achieve whole surface display.

Specific implementation manners of an OLED display panel and a display device provided by embodiments of the present disclosure are illustrated in detail in conjunction with the drawings.

Figure 1:
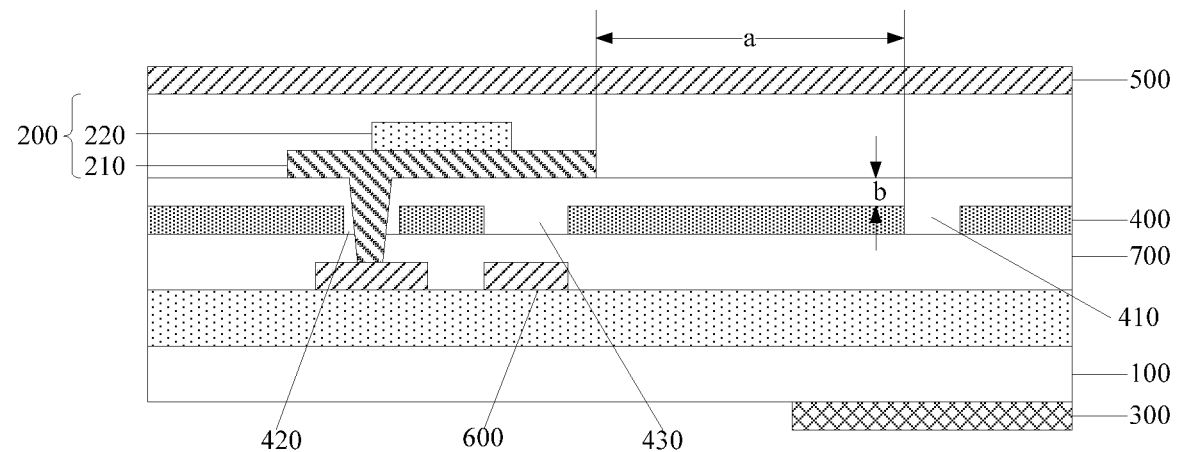
FIG. 1 is a schematically structural side view of an OLED display panel provided by an embodiment of the present disclosure.

The embodiment of the present disclosure provides an OLED display panel, as shown in FIG. 1, comprising: a substrate 100, a plurality of OLED light-emitting devices 200 arranged on a side of the substrate 100, a signal routing and a control device correspondingly connected with the OLED light-emitting devices 200, an image sensor 300 arranged on the other side or the same side of the substrate 100, and a light shielding layer 400 arranged between the image sensor 300 and a film layer where the OLED light-emitting devices 200 are located, the light shielding layer 400 having at least one pinhole imaging region 410.

Figure 2:
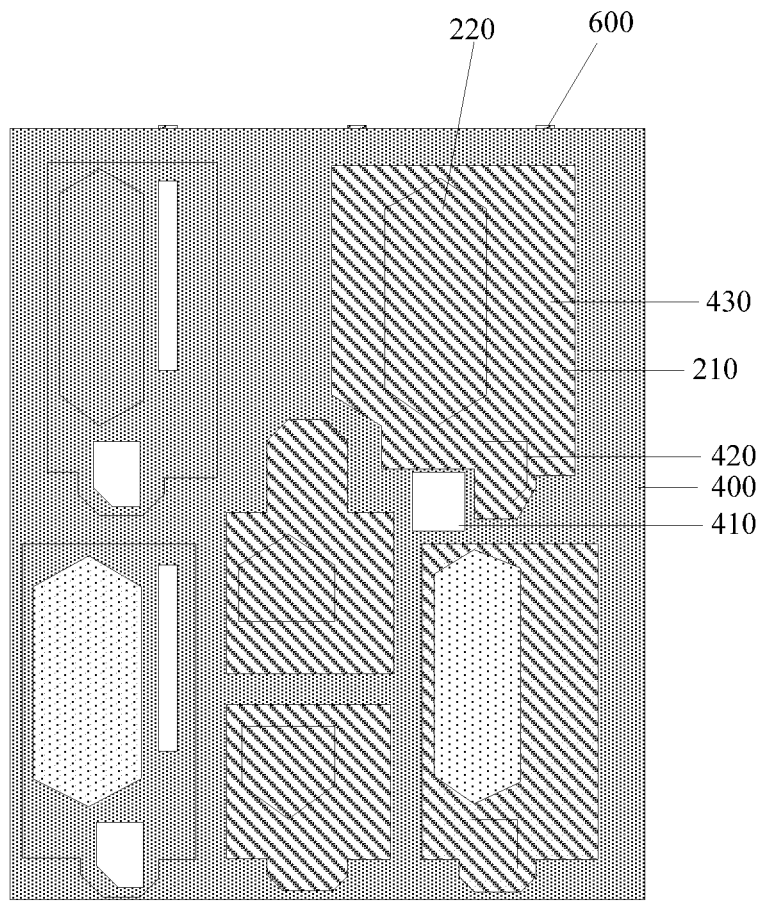
FIG. 2 is a schematically structural top view of the OLED display panel provided by the embodiment of the present disclosure.

As shown in FIG. 2, a region of an orthographic projection of the pinhole imaging region 400 on the substrate 100 is arranged at a corresponding gap position between the OLED light-emitting devices 200, and is staggered from regions of orthographic projections of light shielding parts in the signal routing and the control device on the substrate 100.

The image sensor 300 is used for acquiring an image formed after an object above the OLED display panel passes through the pinhole imaging region 410. For example, when a finger is placed on a surface of the OLED display panel, the image sensor 300 can recognize fingerprints and perform touch detection.

According to the OLED display panel provided by the embodiment of the present disclosure, the image sensor 300 is added below the OLED light-emitting device 200, and the light shielding layer 400 having at least one pinhole imaging region 410 is added between the image sensor 300 and the OLED light-emitting device 200; by arranging the pinhole imaging region 410 corresponding to a gap position between the OLED light-emitting devices 200 in the light shielding layer 400 and staggered from the light shielding parts in the signal routing and the control device, the object located above the OLED display panel is imaged on the image sensor 300. For example, when a finger is placed above the OLED display panel corresponding to the pinhole imaging region 410, fingerprint acquiring and recognizing functions can be achieved. In this way, a fingerprint recognizing function can be achieved in an active area of the OLED display panel, and attached regions of the whole device are reduced, so that a bezelless design is achieved.

In the OLED display panel provided by the embodiment of the present disclosure, the image sensor 300 can be arranged on a back side of the substrate 100 as shown in FIG. 1, and can also be arranged on a front side (namely a surface where the OLED light-emitting device is formed) of the substrate, and the embodiments of the present disclosure are not limited thereto. For example, the image sensor 300 can also be arranged in a whole surface manner, and can also be only arranged below the pinhole imaging region 410 as shown in FIG. 1, and the embodiments of the present disclosure are not limited thereto. For example, a CCD and other devices can be adopted by the image sensor 300 to achieve an image detection function. Hereinafter, illustration is performed in an example in which the image sensor 300 is arranged on the back side of the substrate 100, but the embodiments of the present disclosure are not limited thereto.

In the OLED display panel provided by the embodiment of the present disclosure, the control device correspondingly connected with the OLED light-emitting devices 200, for example, can be a control circuit including a plurality of transistors, the structure of the control device can have a plurality of implementation manners, and the light shielding part of the control device refers to a gate electrode, a source electrode, a drain electrode and other parts in the transistors having a shielding effect on the light.

Figure 3A:
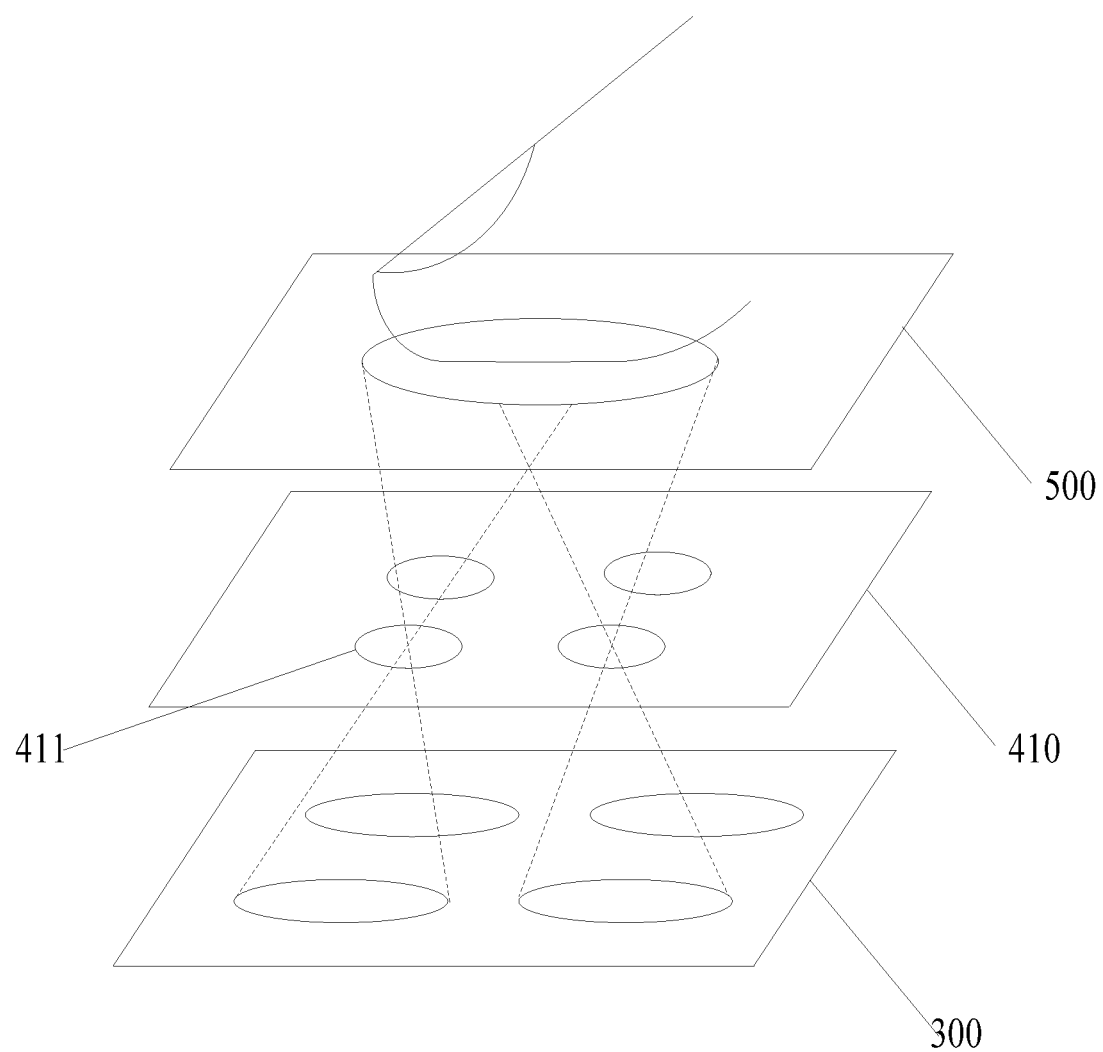
FIGS. 3a and 3b are respectively schematic diagrams of working principle of a pinhole imaging region of the OLED display panel provided by an embodiment of the present disclosure.
Figure 3B:
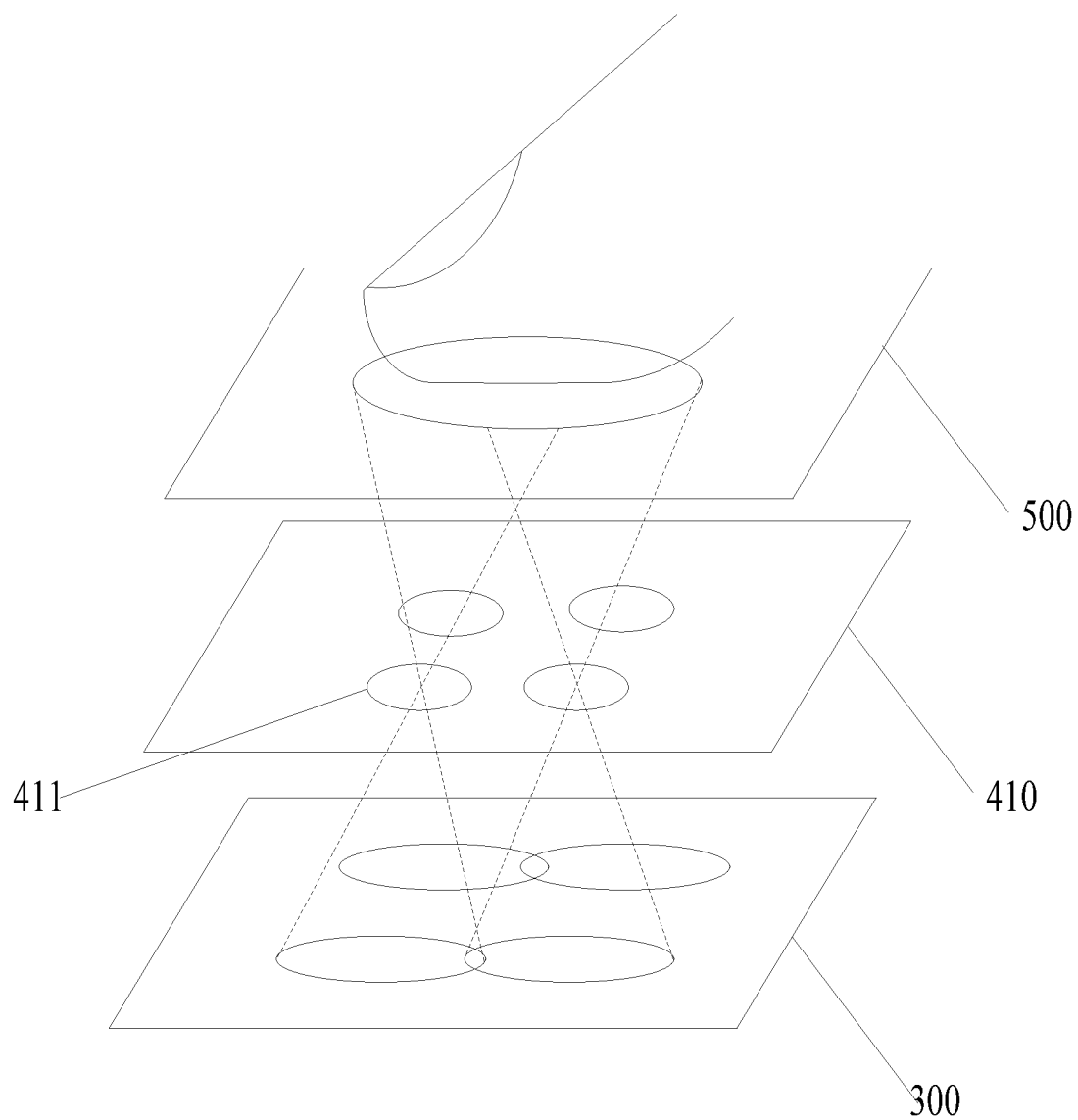

When the fingerprint recognition is performed by adopting a pinhole imaging principle, the imaging at the center of the pinhole is clear, and the closer to the edge of the pinhole, the obscurer the imaging is. In the OLED display panel provided by the embodiment of the present disclosure, a phenomenon that imaging on the edge is obscure is avoided in a manner that each pinhole imaging region 410 is provided with a plurality of holes 411. For example, as shown in FIGS. 3a and 3b, a plurality of holes 411 in an array are formed in the pinhole imaging region 410. As shown in FIGS. 3a and 3b, 2*2 holes 411 are formed in the pinhole imaging region 410, however, the embodiments of the present disclosure are not limited thereto.

For example, each hole 411 in the pinhole imaging region 410 can image part of a fingerprint, and after the image sensor 300 acquires part of a fingerprint image formed by each hole 411, by later image extracting and processing, all parts of the fingerprint image are spliced and integrated into a complete and clear fingerprint image. To facilitate splicing of all the parts of the fingerprint image, a part of the fingerprint image formed by every two adjacent holes 411 includes a part of common fingerprint image.

Figure 4:
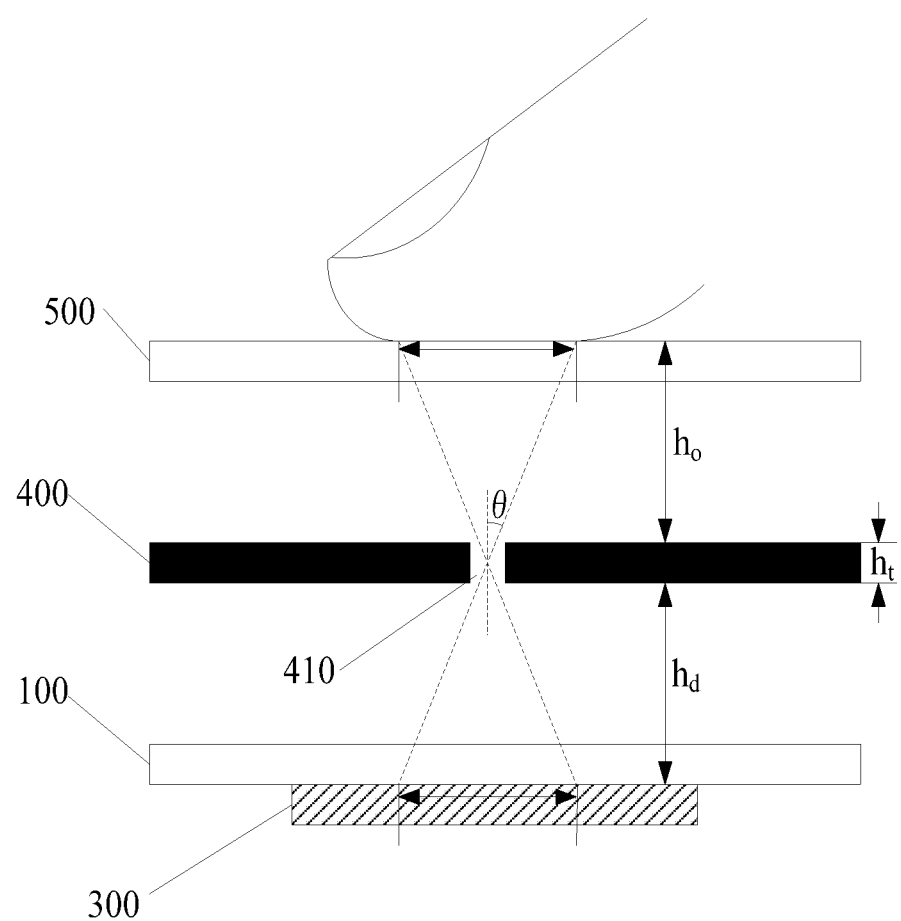
FIG. 4 is a schematic diagram of working principle of pinhole imaging of an OLED display panel provided by another embodiment of the present disclosure.

Furthermore, for example, to allow the image sensor 300 to acquire part of the fingerprint image corresponding to each hole 411, it is needed that the reflecting light of the fingerprints can reach the receiving surface of the image sensor 300. As shown in FIG. 4, it should satisfy a condition that an imaging angle θ is less than a total reflection angle, that is, $\theta < \arcsin(1/n)$, where n is a refractive index of a film layer in contact with the receiving surface of the image sensor 300. For example, when the image sensor 300 is arranged on a bottom surface of the substrate 100, n is a refractive index of the substrate 100.

To allow the imaging to be in one pinhole imaging region 410, as shown in FIG. 3a, part of the fingerprint image formed by every two adjacent holes 411 includes a part of common fingerprint image, and it is required that the center distance d between the two adjacent holes 411 satisfies a formula: $d < 2*(h_o + h_t/2)*\tan(\arcsin(1/n))$, where n is a refractive index of the film layer in contact with the receiving surface of the image sensor 300, $h_t$ is a thickness of the light shielding layer 400, and $h_o$ is a distance between an upper surface of the light shielding layer 400 and an upper surface 500 (namely a surface in contact with the fingerprints) of the OLED display panel.

In addition, in the OLED display panel provided by the embodiment of the present disclosure, to avoid overlapping between images of two adjacent holes 410 as shown in FIG. 3b, and prevent difficulties to the later image extracting and processing, the center distance d between the two adjacent holes satisfies a formula: $d > 2*(h_d + h_t/2)*\tan(\arcsin(1/n))$, where n is a refractive index of the film layer in contact with the receiving surface of the image sensor 300, $h_t$ is a thickness of the light shielding layer 400, and $h_d$ is a distance between a lower surface of the light shielding layer 400 and an upper surface of the image sensor 300.

In the OLED display panel provided by the embodiment of the present disclosure, to improve imaging preciseness, such as preciseness of fingerprint recognition, it is needed to arrange each hole 411 as small as possible, but, if the hole 411 is too small, illuminance of the receiving surface of the image sensor 300 may be too low, leading to a difficulty to extract image data, thus, for example, the diameter of the hole 411 can be designed according to an internal structure of the OLED display panel and the light sensitivity of the image sensor 300 in use. For example, the diameter of each hole 411 is designed to be in a range from 5 μm and 20 μm, and, for example, the diameter of the hole 411 can be 5 μm.

For example, in the OLED display panel provided by the embodiment of the present disclosure, as shown in FIG. 1, the pinhole imaging region 410 and an OLED light-emitting device 200 closest to the pinhole imaging region 410 are constructed to meet a relationship: a horizontal distance a between the pinhole imaging region 410 and the OLED light-emitting device 200 closest to the pinhole imaging region 410 is larger than a vertical distance b between the pinhole imaging region 410 and the OLED light-emitting device 200 closest to the pinhole imaging region 410, so as to avoid a situation that the light shielding layer 400 having the pinhole imaging region 410 is arranged below the film layer where the OLED light-emitting devices 200 are located, and the light emitted by the OLED light-emitting device 200 may affect the imaging of the pinhole imaging region 410.

For example, in the OLED display panel provided by the embodiment of the present disclosure, as shown in FIG. 1, the signal routing includes: data lines 600 arranged between the film layer where the OLED light-emitting devices are located and the substrate 100, direct current voltage signal line(s), gate lines and the like. Besides, a source electrode and a drain electrode of a thin film transistor included in the control device are commonly arranged on a same layer as the data line(s) 600 and the direct current voltage signal line(s), and a gate electrode is commonly arranged on a same layer as the gate line(s).

In consideration of the imaging condition of the pinhole imaging region 410 and other factors, the light shielding layer 400 is adopted to shield stray light as much as possible and reduce effects of the stray light on pinhole imaging, so that the imaging quality can be improved. For example, the added light shielding layer 400 can be arranged between the film layer where the OLED light-emitting device 200 is located and the film layer where the data lines 600 are located; besides, to enable each OLED light-emitting device 200 to operate regularly, as shown in FIG. 1, the light shielding layer 400 is provided with a connecting through hole 420 used for connecting other patterns (for example, a drain electrode or a pattern including the drain electrode) of a drain electrode of some transistor in the film layer where the data lines 600 are located with an anode 210 in the OLED light-emitting device 200.

For a whole surface type film layer with holes in some portions, to prevent that the stray light may transmit through a position of the connecting through hole 420 of the light shielding layer 400 and the pinhole imaging is affected, for example, in the OLED display panel provided by the embodiment of the present disclosure, as shown in FIG. 1, the anode 210 in the OLED light-emitting device 200 can be arranged into a layer stack structure including a light shielding metal film layer; for example, an ITO/Ag/ITO structure can be adopted to prepare the anode 210; and in this case, the anode 210 of the OLED light-emitting device 200 is a light-proof film layer. In this way, the anode 210 can be utilized for shielding the connecting through hole 420 in the light shielding layer 400, an orthographic projection of the anode 210 in the OLED light-emitting device 200 on the substrate 100 is made to cover an orthographic projection of the connecting through hole 420; that is, the anode 210 and the light shielding layer 400 are overlapped in a direction perpendicular to the substrate 100.

For example, in the OLED display panel provided by the embodiment of the present disclosure, the light shielding layer 400 is a whole surface type film layer with holes in some portions, the direct current voltage signal line(s) originally arranged on a same film layer as the data lines 600 can be omitted; that is, the signal routings included in the film layer where the data lines 600 are located are only the data lines 600. The light shielding layer 400 is made of a conductive material, and the light shielding layer 400 is utilized to achieve function(s) of the direct current voltage signal line, that is, the light shielding layer 400 is a conductive layer used for loading direct current voltage signal(s). In this case, to avoid a short circuit between the light shielding layer 400 and the data lines 600, an insulating layer 700 can be added between the light shielding layer 400 and the film layer where the data lines 600 are located.

Compared with an instance that the data lines 600 and the direct current voltage signal line(s) are arranged on a same layer, the data lines 600 and the direct current voltage signal line(s) are both needed to be arranged at gap positions among the OLED light-emitting devices 200, in this way, to meet a requirement of alternating current loading (AC loading) of signal transmission of the data lines 600, the line width of the data line 600 is required to be made narrower, and to reduce the electrical resistance, the film layer where the data lines are located is thicker. Functions of the direct current voltage signal line(s) are transferred to the light shielding layer 400, in this way, the arrangement space of the data lines 600 in the film layer can be increased, and the electrical resistance value is reduced. For example, in an instance that the data lines 600 and the direct current voltage signal line(s) are arranged on a same layer, the line width of each data line 600 is 2.3 µm, and the thickness is 750 nm; after the functions of the direct current voltage signal line(s) are transferred to the light shielding layer, the line width of the data line 600 can be larger than 2.3 µm, and the thickness of the film layer where the data lines 600 are located can be less than 700 nm. For example, the line width of the data line 600 can be 3.5 µm, and the thickness of the film layer where the data lines 600 are located can be reduced to 500 nm.

Furthermore, for example, in the OLED display panel provided by the embodiment of the present disclosure, in an example that the light shielding layer 400 is a conductive layer used for loading a direct current voltage signal, as shown in FIG. 1, a hollow region 430 above at least part of the data line can be arranged in the light shielding layer 400, that is, under a condition that continuity of a film layer of the light shielding layer 400 is permitted, a hole can be formed in the light shielding layer 400 above the data line 600 so as to reduce the overlapping capacitance of the light shielding layer 400 and the data line 600, and avoid a possible signal mutual interference. In this case, to avoid effects of the stray light on the pinhole imaging through the hollow area 430, when the anode 210 of the OLED light-emitting device 200 is a light-proof film layer, the anode 210 can be utilized for shielding the hollow region 430 in the light shielding layer 400, so that an orthographic projection of the anode 210 in the OLED light-emitting device 200 on the substrate 100 is made to cover an orthographic projection of the hollow region 430.

Furthermore, for example, in the OLED display panel provided by the embodiment of the present disclosure, an effect of shielding the stray light through the hollow region 430 in the light shielding layer 400 and the connecting through hole 420 is achieved by increasing the area of the anode 210 of the OLED light-emitting device 200. For example, the above requirement can be met only by increasing the area of the anode 210 in the OLED light-emitting device(s) 200, that is, to keep a relative proportion relationship of light-emitting colors, the area of the light-emitting layer 220 (EL) in the OLED light-emitting device(s) 200 is not changed, in this case, the area of the anode 210 in the OLED light-emitting device(s) 200 can be larger than the area of the light-emitting layer 220 in the OLED light-emitting device(s) 200.

Under a same innovative concept, an embodiment of the present disclosure also provides a display device, comprising the OLED display panel provided by the embodiment of the present disclosure. The display device can be any product or component with a display function, such as a mobile phone, a tablet personal computer, a TV set, a display, a notebook computer, a digital photo frame, a navigator or the like. Implementation of the display device can refer to the embodiments of the OLED display panel, which would not be described for the repeated details.

According to the OLED display panel and the display device provided by the embodiments of the present disclosure, the image sensor is added below the OLED light-emitting device, and the light shielding layer having at least one pinhole imaging region is added between the image sensor and the OLED light-emitting device. By arranging the pinhole imaging region corresponding to the gap position between the OLED light-emitting devices in the light shielding layer and staggered from the light shielding parts in the signal routing and the control device, the object located above the OLED display panel is imaged on the image sensor, and when a finger is placed above the OLED display panel corresponding to the pinhole imaging region, the fingerprint acquiring and recognizing function can be achieved. In this way, the fingerprint recognition function can be achieved in the active area of the OLED display panel, and the attached regions of the whole device are reduced, so that a bezelless design is achieved.

The described above are only exemplary embodiments of the present disclosure, and the present disclosure is not intended to be limited thereto. For one of ordinary skill in the art, various changes and alternations may be readily contemplated without departing from the technical scope of the present disclosure, and all of these changes and alternations shall fall within the scope of the present disclosure.

The present application claims priority of Chinese Patent Application No. 201611207500.8 filed on Dec. 23, 2016 to SIPO and entitled "An OLED display panel and a display device," the disclosure of which is incorporated herein by reference in its entirety.

What is claimed is:

1. An OLED display panel, comprising:
    a substrate;
    a plurality of OLED light-emitting devices arranged on a side of the substrate;
    a signal routing and a control device correspondingly connected with the OLED light-emitting devices;
    an image sensor arranged on the other side or the same side of the substrate; and
    a light shielding layer arranged between the image sensor and a film layer where the OLED light-emitting devices are located, the light shielding layer comprising at least one pinhole imaging region;
    wherein an orthographic projection position of the pinhole imaging region on the substrate is arranged at a gap position between the OLED light-emitting devices, and is staggered from orthographic projection positions of light shielding parts in the signal routing and the control device on the substrate;
    the image sensor is configured to acquire an image formed after an object above the OLED display panel passes through the pinhole imaging region;

the signal routing comprises a data line arranged between the film layer where the OLED light-emitting devices are located and the substrate;

the light shielding layer is arranged between the film layer where the OLED light-emitting devices are located and a film layer where the data line is located; and the light shielding layer further comprises: a connecting through hole configured to connect a drain electrode in the film layer where the data line is located, or a pattern comprising the drain electrode with an anode in the OLED light-emitting device.

2. The OLED display panel according to claim 1, wherein the pinhole imaging region comprises a plurality of holes distributed in an array.

3. The OLED display panel according to claim 2, wherein, in a pinhole imaging region, a center distance d between every two adjacent holes satisfies one of the following or a combination relationship:

$$d<2*(h_o+h_r/2)*\tan(\arcsin(1/n)), d>2*(h_d+h_r/2)*\tan(\arcsin(1/n));$$

where n is a refractive index of a film layer in contact with a receiving surface of the image sensor, $h_d$ is a distance between a lower surface of the light shielding layer and an upper surface of the image sensor, $h_r$ is a thickness of the light shielding layer, and $h_o$ is a distance between an upper surface of the light shielding layer and an upper surface of the OLED display panel.

4. The OLED display panel according to claim 3, wherein each hole has a diameter in a range of 5 μm to 20 μm.

5. The OLED display panel according to claim 2, wherein each hole has a diameter in a range of 5 μm to 20 μm.

6. The OLED display panel according to claim 1, wherein the pinhole imaging region and a corresponding OLED light-emitting device of the closest to the pinhole imaging region satisfy a following relationship:

a horizontal distance between the pinhole imaging region and the corresponding OLED light-emitting device closest to the pinhole imaging region is larger than a vertical distance between the pinhole imaging region and the corresponding OLED light-emitting device closest to the pinhole imaging region.

7. The OLED display panel according to claim 1, wherein the anode in the OLED light-emitting device comprises a layer stack structure comprising a light shielding metal film layer; and an orthographic projection of the anode in the OLED light-emitting device on the substrate covers an orthographic projection of the connecting through hole.

8. The OLED display panel according to claim 7, wherein the anode in the OLED light-emitting device has an area larger than that of a light-emitting layer in the OLED light-emitting device.

9. The OLED display panel according to claim 1, wherein the signal routing included in the film layer where the data line is located is a data line; and the light shielding layer is a conductive layer configured to load a direct current voltage signal.

10. The OLED display panel according to claim 9, wherein the light shielding layer further comprises a hollow region arranged above at least a part of the data line; and the anode in the OLED light-emitting device comprises a layer stack structure comprising a light shielding metal film layer, and an orthographic projection of the anode on the substrate covers an orthographic projection of the hollow region.

11. The OLED display panel according to claim 9, wherein the data line has a line width larger than 2.3 μm, and the film layer where the data line is located has a thickness less than 700 nm.

12. The OLED display panel according to claim 11, wherein the line width of the data line is 3.5 μm, and the thickness of the film layer where the data line is located is 500 nm.

13. The OLED display panel according to claim 1, wherein the image sensor is arranged in a whole surface manner, or is only arranged below the pinhole imaging region.

14. The OLED display panel according to claim 1, wherein the anode in the OLED light-emitting device comprises a layer stack structure comprising a light shielding metal film layer; and an orthographic projection of the anode in the OLED light-emitting device on the substrate covers an orthographic projection of the connecting through hole.

15. The OLED display panel according to claim 1, wherein the signal routing included in the film layer where the data line is located is a data line; and the light shielding layer is a conductive layer configured to load a direct current voltage signal.

16. The OLED display panel according to claim 15, wherein the light shielding layer further comprises a hollow region arranged above at least a part of the data line; and the anode in the OLED light-emitting device comprises a layer stack structure comprising a light shielding metal film layer, and an orthographic projection of the anode on the substrate covers an orthographic projection of the hollow region.

17. A display device, comprising an OLED display panel, wherein the OLED display panel comprises:

a substrate;

a plurality of OLED light-emitting devices arranged on a side of the substrate;

a signal routing and a control device correspondingly connected with the OLED light-emitting devices;

an image sensor arranged on the other side or the same side of the substrate; and a light shielding layer arranged between the image sensor and a film layer where the OLED light-emitting devices are located, the light shielding layer comprising at least one pinhole imaging region;

wherein an orthographic projection position of the pinhole imaging region on the substrate is arranged at a gap position between the OLED light-emitting devices, and is staggered from orthographic projection positions of light shielding parts in the signal routing and the control device on the substrate;

the image sensor is configured to acquire an image formed after an object above the OLED display panel passes through the pinhole imaging region;

the signal routing comprises a data line arranged between the film layer where the OLED light-emitting devices are located and the substrate;

the light shielding layer is arranged between the film layer where the OLED light-emitting devices are located and a film layer where the data line is located; and the light shielding layer further comprises: a connecting through hole configured to connect a drain electrode in the film layer where the data line is located, or a pattern comprising the drain electrode with an anode in the OLED light-emitting device.

* * * * *